United States Patent [19]

Jones

[11] Patent Number: 5,511,227
[45] Date of Patent: Apr. 23, 1996

[54] METHOD FOR CONFIGURING A COMPOSITE DRIVE FOR A DISK DRIVE ARRAY CONTROLLER

[75] Inventor: Craig S. Jones, Austin, Tex.

[73] Assignee: Dell USA, L.P., Austin, Tex.

[21] Appl. No.: 130,055

[22] Filed: Sep. 30, 1993

[51] Int. Cl.[6] .................................................. G06F 13/10
[52] U.S. Cl. .................... 395/829; 395/700; 364/DIG. 1; 364/248.1
[58] Field of Search .................................. 395/650, 425, 395/700, 829

[56] References Cited

U.S. PATENT DOCUMENTS

| | | | |
|---|---|---|---|
| 4,811,279 | 3/1989 | Bean et al. | 364/900 |
| 4,965,801 | 10/1990 | Dulac | 371/40.1 |
| 5,101,492 | 3/1992 | Schultz et al. | 395/575 |
| 5,124,987 | 6/1992 | Milligan et al. | 371/10.1 |
| 5,148,432 | 9/1992 | Gorden et al. | 371/10.1 |
| 5,166,939 | 11/1992 | Jaffe et al. | 371/40.1 |
| 5,210,860 | 5/1993 | Pfeffer et al. | 395/575 |
| 5,247,638 | 9/1993 | O'Brien et al. | 395/425 |
| 5,249,279 | 9/1993 | Schmenk et al. | 395/425 |
| 5,274,645 | 12/1993 | Idleman et al. | 371/10.1 |
| 5,303,244 | 4/1994 | Watson | 371/10.1 |
| 5,305,326 | 4/1994 | Solomon et al. | 371/11.1 |
| 5,313,585 | 5/1993 | Jeffries et al. | 395/275 |
| 5,313,626 | 5/1994 | Jones et al. | 395/575 |
| 5,331,646 | 7/1994 | Krueger et al. | 371/40.1 |

FOREIGN PATENT DOCUMENTS

| | | | |
|---|---|---|---|
| 0449413 | 2/1992 | Japan | G06F 3/06 |

OTHER PUBLICATIONS

Brown, Bruce, "Northgate OmniArray", (one of three evaluations of disk drive arrays) Computer Shopper, v12, n7, p203(2) Jul, 1992.

O'Brien, Bill, "The EISA edge", (includes related article on Dell Computer Corp drive array), Computer Shopper, v12, n5, p 178(9) May, 1992.

(No author given) "Storage: Compaq intros high-capacity array system for SystemPro", Edge: Work-Group Computing Report, v2, n39, p10(1) Feb 18, 1991.

*Primary Examiner*—Kevin A. Kriess
*Assistant Examiner*—St. John Courtenay, III
*Attorney, Agent, or Firm*—Henry Garrana; Michelle Turner; Mark Kahler

[57] ABSTRACT

A method for configuring at least one composite drive for a disk drive array controller. A disk drive array controller having a memory portion on which a list of composite drives which may be installed on a bus of a computer system is stored thereon is provided. A plurality of disk drives are then installed on the bus of the computer system. Each of the disk drives includes a user data region, a first portion of which contains a first field containing a composite drive ID number for a composite drive and a second field which indicates the total number of disk drives in the composite drive corresponding to the composite drive ID number and a second portion of which contains a position of the disk drive within the composite drive corresponding to the composite drive ID number. The composite drive ID for each of the disk drives is compared to the list of composite drives and a configuration is determined for each listed composite drive which matches at least one of the composite drive IDs stored in the disk drives. The configuration for each of the matching composite drives is then determined using the total number of disk drives listed in the first field of each of the disk drives having the matching composite drive ID and the positions of the disk drives within the composite drive matching the composite drive ID. Each of the matching composite drives are then mapped using the determined configurations.

12 Claims, 2 Drawing Sheets

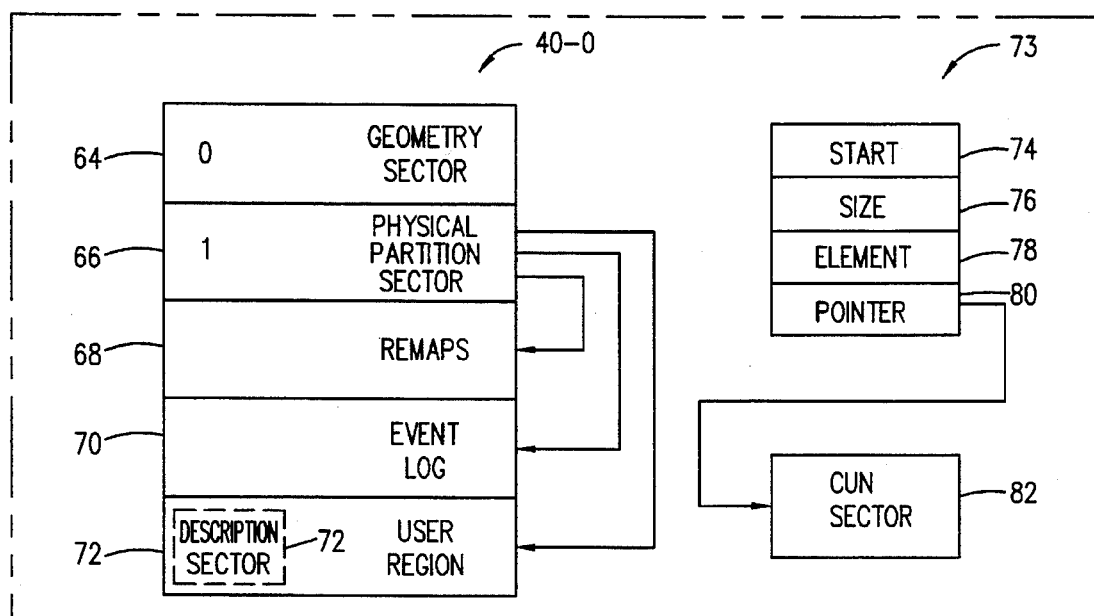
FIGURE 2
FIGURE 3
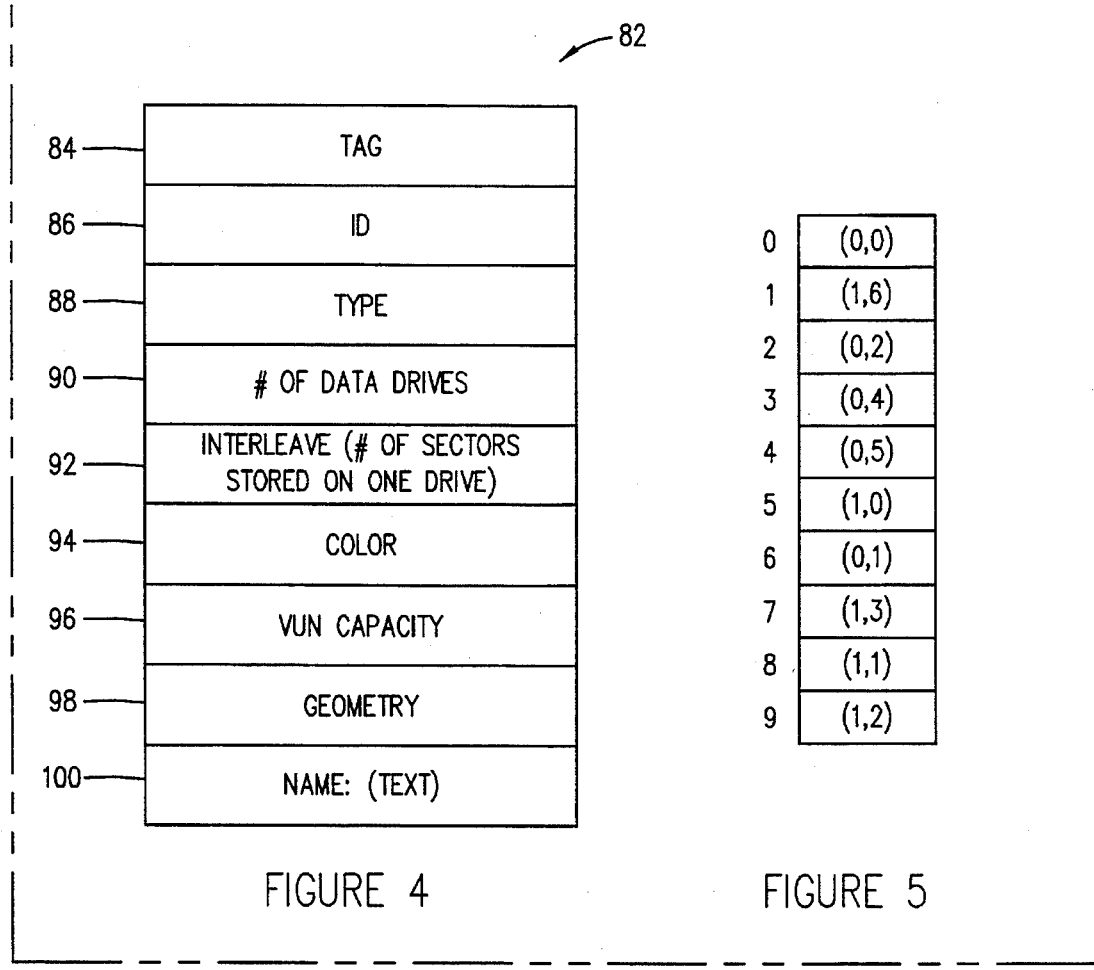
FIGURE 4
FIGURE 5

METHOD FOR CONFIGURING A COMPOSITE DRIVE FOR A DISK DRIVE ARRAY CONTROLLER

REFERENCE TO RELATED APPLICATION

This application is related to applications:

U.S. Ser. No. 08/145,008, entitled "SCSI PASS-THROUGH", now pending.

U.S. Ser. No. 08/144,118, entitled "SELECTIVE WRITE-BACK CACHING", now abandoned.

U.S. Ser. No. 08/092,044, entitled "MULTIPLE FUNCTION INTERFACE DEVICE FOR OPTION CARD", now pending.

U.S. Ser. No. 08/132,738, entitled "SCATTER-GATHER DMA ADDRESS GENERATOR", now pending and U.S. Ser. No. 08/104,225, entitled "MULTI-PURPOSE USAGE OF TRANSACTION BACKOFF AND BUS ARCHITECTURE SUPPORTING SAME", now pending. which are hereby incorporated by reference.

BACKGROUND OF THE INVENTION

1. Field of the Invention

The invention relates to a method for configuring a composite drive for a disk drive array controller, and more particularly, to a method for configuring a composite drive for a disk drive array controller which combines data, a first portion of which is unique to each disk drive comprising part of the composite drive and a second portion of which is common to all disk drives forming the composite drive, stored by the disk drives together with data stored by the disk drive array controller to configure the composite drive.

2. Description of Related Art

A disk drive controller is a peripheral interface unit, typically installed on an expansion bus for a computer system, which converts input/output (or "I/O") read and write requests into a sequence of seeks, delays and data transfer operations in which data is read from or stored to a disk drive coupled thereto. A disk drive array controller performs similar tasks for a set of disk drives coupled thereto. However, the disk drive array controller does not differ from a simple disk drive controller merely in the number of disk drives for which it performs such operations. More importantly, the disk drive array controller differs from the disk drive controller in that, with respect to the disk drive array controller, the set of disk drives coupled thereto emulate a single disk drive having a greater capacity and higher performance characteristics than any individual disk drive included as a portion thereof. This large, higher performance disk drive emulated by the set of disk drives is referred to as a "composite" drive. To perform an access to a specified location within the composite drive, the disk drive array controller must know both the position of the particular disk drive to be accessed, as well as the location within that disk drive, which corresponds to the composite drive location for which access is sought.

As one skilled in the art should readily appreciate, the replacement and/or substitution of disk drives is appreciably simpler for a disk drive controller than for a disk drive array controller. As the disk drive controller views a disk drive in its entirety, a replacement disk drive can be coupled to the controller and, provided necessary information regarding the configuration of the disk drive is provided to the disk drive controller, the disk drive controller will be able to immediately access the replacement disk drive. Similarly, a user can move a disk drive to a new disk drive controller without losing any data on the disk drive. For disk drive array controllers, however, disk drives are typically installed at specific positions or "slots" on a common bus or buses and, when the disk drive array controller configures the set of disk drives forming the composite drive, the disk drive array controller will memorize the identity, position and use for each of the disk drives. This information is then provided to each disk drive. Accordingly, after configuration is complete, each disk drive knows its particular location within a composite drive. However, if one of the disk drives is then moved to a different location, that disk drive will no longer know its location within the composite drive. As a result, the user is not always able to immediately use the disk drive after it has been moved. In addition, loss of data may also occur when the disk drive is moved.

It can be readily seen from the foregoing that it would be desirable to store all of the information which describes both the composite drive and a particular disk drive which forms a portion of the composite drive on the disk drive itself so that, when the drive is moved, the information needed to configure the disk drive moves with the drive itself. Accordingly, it is an object of the present invention to provide a method for configuring a composite drive for a disk drive array controller which enhances the ability of a user to remove, replace or otherwise move the disk drives which comprise the composite drive.

SUMMARY OF THE INVENTION

In one embodiment, the present invention is of a method for configuring a composite drive for a disk drive array controller. A plurality of disk drives is installed on a bus of a computer system. Each of the disk drives includes a user data region, a first portion of which contains information common to each of the disk drives and a second portion of which contains information specific to each of the disk drives. The information common to the disk drives and stored in the first portion thereof is combined with the information specific to each individual disk drives and stored in the second portion thereof to determine a configuration for the composite drive. The composite drive is then mapped using the determined configuration.

In various aspects of this embodiment of the invention, the information stored in the first portion of the disk drives is a physical description of the composite drive while the information stored in the second portion of the disk drives is comprised of a position of that disk drive within the composite drive. In this aspect of the invention, the physical description of the composite drive is combined with the positions of the disk drives to determine the configuration of the composite drive. In a more particular aspect of the invention, the physical description of the composite drive includes the total number of disk drives included as part of the composite drive, which, in a still more particular aspect of this embodiment of the invention, may be determined by combining the total number of disk drives in the composite drive used for data storage and the total number of disk drives in the composite drive used for data redundancy.

In another embodiment, the present invention is of a method for configuring at least one composite drive for a disk drive array controller. A disk drive array controller having a memory portion on which a list of composite drives which may be installed on a bus of a computer system is stored thereon is provided. A plurality of disk drives is then installed on the bus of the computer system. Each of the disk drives includes a user data region, a first portion of which contains information common to each of the disk drives and a second portion of which contains information specific to each of the disk drives. The information common to the disk drives and stored in the first portion thereof is combined with the information specific to each individual disk drive and stored in the second portion thereof and the information stored in the disk drive array controller to determine a configuration for the composite drive. The composite drive is then mapped using the determined configuration.

In various aspects of this embodiment of the invention, the information stored in the first portion of the disk drives includes a composite drive ID for a first one of the listed composite drives and a physical description of the first composite drive and the information stored in the second portion of the disk drives is comprised of a position of that disk drive within the first composite drive. In this aspect of the invention, the composite drive ID for the first composite drive is compared to the list of composite drives stored in the disk drive array controller and the listed composite drives which match the composite drive IDs stored in the disk drives are selected for configuration. The position of each of the disk drives corresponding to the selected composite drives are then combined with the physical description of the composite drives to determine the configuration thereof. In a more particular aspect of the invention, the physical description of the composite drives includes the total number of disk drives included as part of the composite drive, which, in a still more particular aspect of this embodiment of the invention, may be determined by combining the total number of disk drives in the composite drive used for data storage and the total number of disk drives in the composite drive used for data redundancy.

In still yet another embodiment, the present invention is of a method for configuring at least one composite drive for a disk drive array controller. A disk drive array controller having a memory portion on which a list of composite drives which may be installed on a bus of a computer system is stored thereon is provided. A plurality of disk drives are then installed on the bus of the computer system. Each of the disk drives includes a user data region, a first portion of which contains a first field containing a composite drive ID number for a composite drive and a second field which indicates the total number of disk drives in the composite drive corresponding to the composite drive ID number and a second portion of which contains a position of the disk drive within the composite drive corresponding to the composite drive ID number. The composite drive ID for each of the disk drives is compared to the list of composite drives and a configuration is determined for each listed composite drive which matches at least one of the composite drive IDs stored in the disk drives. The configuration for each of the matching composite drives is then determined using the total number of disk drives listed in the first field of each of the disk drives having the matching composite drive ID and the positions of the disk drives within the composite drive matching the composite drive ID. Each of the matching composite drives are then mapped using the configurations determined therefor.

BRIEF DESCRIPTION OF THE DRAWING

The present invention may be better understood, and its numerous objects, features and advantages will become apparent to those skilled in the art by reference to the accompanying drawings, in which:

FIG. 2 is a layout of a disk drive included as part of the composite drive illustrated in FIG. 1;

FIG. 3 is an expanded layout of a description sector of a user region of the disk drive illustrated in FIG. 2;

FIG. 4 is an expanded layout of a composite unit (or "CUN") sector of the description sector of the user region illustrated in FIG. 3: and FIG. 5 is a virtual map of the composite drive of FIG. 1.

DETAILED DESCRIPTION

Figure 1:
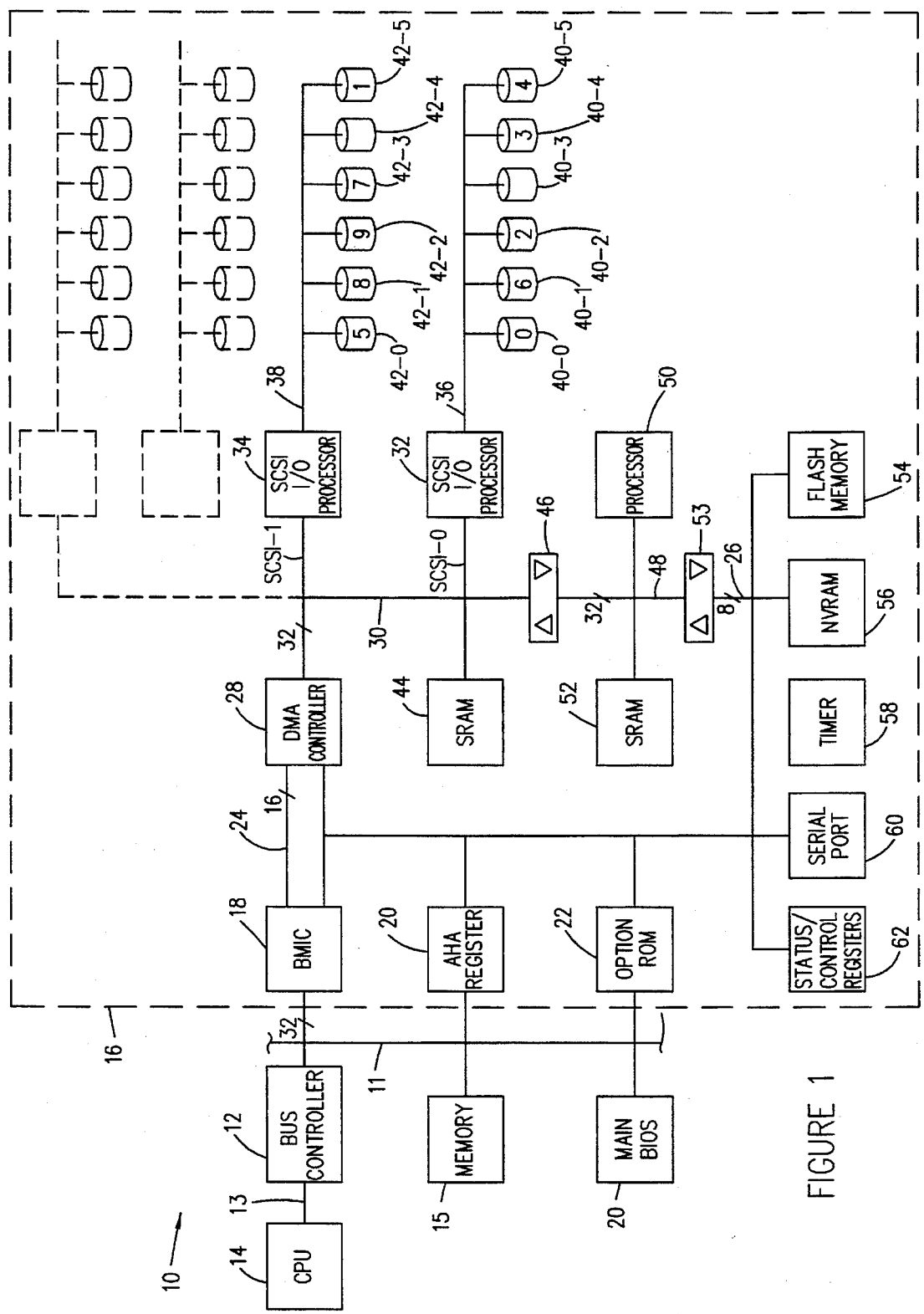
FIG. 1 is a block diagram of a computer system having a disk drive array controller and an associated composite drive configurable in accordance with the teachings of the present invention.

Referring first to FIG. 1, a computer system 10 having a disk drive array controller 16 incorporated therein will now be described in greater detail. More specifically, the computer system 10 includes an expansion bus 11 for bi-directional exchanges of address, data and control signals between various components of the computer system 10 such as a central processing unit (or "CPU") 14, and memory 15 associated with the expansion bus 11. Preferably, the expansion bus 11 should be a 32-bit extended industry standard architecture (or "EISA") type expansion bus having a transfer rate on the order of 33 MBytes per second and the CPU 14 should be coupled to the expansion bus 11 by a bus controller 12 which controls the exchange of signals between host bus 13, to which the CPU 14 is electrically coupled thereto, and the expansion bus 11.

Also installed on the EISA system bus 12 is the disk array controller card 16. Residing on the EISA system bus 11 and providing interfaces between the disk array controller card 16 and the EISA system bus 11 are a bus master interface chip (or "BMIC") 18, for example, an 82355 BMIC manufactured by Intel Corporation of Santa Clara, Calif., AHA emulation registers 20, which emulate, for example, 154X AHA registers manufactured by Adaptec, Inc., and an 8-bit option ROM 22. The BMIC 18 is a 32-bit bus master and I/O slave clocked at 16.7 MHz for the transfer of data and addresses between the EISA system bus 11 and a 16-bit DMA bus 24 of the disk array controller card 16. The AHA registers 20 are an 8-bit ISA I/O slave for the transfer of data and addresses between the EISA system bus 11 and an 8-bit extension bus 26 of the disk array controller card 16. The 8-bit option ROM 22 contains the basic input output system (or "BIOS") for the disk array controller card 16 and, upon boot, provides the CPU 14 and main BIOS 23 with data needed to initialize the disk array controller card 16.

A DMA controller 28 separates the 16-bit DMA bus 24 and a 32-bit local I/O bus 30 for the disk array controller card 16. The DMA controller 28 is comprised of a first portion which includes first-in first-out (or "FIFO")type registers to buffer data being transferred between the 16-bit DMA bus 24 and the 32-bit local I/O bus 30 and a second portion which includes yet another FIFO to provide a portion of each address in memory from/to which data is being transferred. By this use of data and address FIFOs, the DMA controller 28 provides for very efficient transfers of data between the DMA bus 24 and the local I/O bus 30 with minimal processor overhead. For more specific information on the DMA controller 28, please see co-pending application DC-00307.

Also residing on the local I/O bus 30 for the disk array controller card 16 are first and second small computer system interface (or "SCSI") channels SCSI-0 and SCSI-1.

Each SCSI channel includes a SCSI input/output (or "I/O") processor 32, 34 which provide respective interfaces between the local I/O bus 30 and SCSI buses 36, 38. Each SCSI I/O processor, which, for example, may be a type 53C710 processor manufactured by NCR clocked at 33.3 MHz, controls the bi-directional transfer of data to or from a selected one of auxiliary memory storage systems 40-0 through 40-5, 42-0 through 42-5 which reside on the SCSI bus 36, 38, respectively. Data stored in the auxiliary memory storage systems 40-0 through 40-5, 42-0 through 42-5, which, for example, may include one or more SCSI disk drive type data storage devices, may be transferred by the SCSI I/O processor 32, 34 to a static random access memory (or "SRAM") 44 which acts as a shared memory for the SCSI I/O processors 32, 34. From the SRAM 44, data transfers to the EISA system bus 11 are controlled by the BMIC 18. The SCSI I/O processors 32, 34 may also fetch data or instructions from the SRAM 44 for transfer to the auxiliary memory storage systems 36, 38. It should be noted, however, that while FIG. 1 illustrates a pair of SCSI channels SCSI-0, SCSI-1 coupled to the local I/O bus 30, it is specifically contemplated that any number of additional SCSI channels, two of which are illustrated in phantom in FIG. 1, may also be coupled to the local I/O bus 30.

Bridge 46 provides an interface between the local I/O bus 30 and a 32-bit local bus 48 for the disk array controller card 16. The local bus 48 is controlled by processor 50 which, for example, may be a 80960CA processor manufactured by Intel Corporation and clocked at 33.3 MHz. Together with a 0.5 MB SRAM 52 which contains code and data required for communication and control purposes, the processor 50 communicates with the EISA system bus 11 and controls the hardware residing on the extension bus 26 of the disk array controller card 16.

Bridge 53 provides an interface between the local bus 48 and the 8-bit extension bus 26 which permits the processor 50 to control the extension bus 26 as well. Residing on the extension bus 26 are a 256 KB FLASH memory 54, an 8 KB non-volatile random access memory (or "NVRAM") 56, timer 58, serial port 60 and status/control registers 62.

As will be more fully described below, selected ones of the SCSI disk drives 40-0 through 40-5, 42-0 through 42-5 comprise a composite drive for the disk array controller card 16. For example, in the embodiment of the invention disclosed herein, the composite drive for the disk array controller card 16 is comprised of ten SCSI disk drives, specifically SCSI disk drives 40-0, 40-1, 40-2, 40-4, 40-5, 42-0, 42-1, 42-2, 42-3 and 42-5, respectively mapped within the composite drive as SCSI disk drives 0, 6, 2, 3, 4, 5, 8, 9, 7 and 1. It should be clearly understood, however, that while the embodiment of the invention described herein discloses the composite drive as being comprised of a series of SCSI disk drives, it is specifically contemplated that the invention is equally suitable for use in conjunction with other types of disk drives such as IDE type disk drives.

As will also be more fully described below, the method of configuring the composite drive for the disk array controller 16 subject of the present application utilizes a combination of information stored on each of the SCSI disk drives 40-0, 40-1, 40-2, 40-4, 40-5, 42-0, 42-1, 42-2, 42-3 and 42-5, a first portion of which is common to all of the SCSI disk drives and a second portion of which is unique to each SCSI disk drive, included as part of the composite drive and information stored in the NVRAM 56 to configure the composite drive for the disk drive array controller 16.

Referring next to FIG. 2, the layout of a disk drive, for example, the SCSI disk drive 40-0 of FIG. 1, will now be described in greater detail. As may now be seen, the SCSI disk drive 40-0 is laid out to include a geometry sector 64 which contains the physical parameters necessary to control the SCSI disk drive 40-0 and a physical partition sector 66 which determines how data is laid out within the remainder of the SCSI disk drive 40-0 by subdividing the physical partition sector 66 into various regions and providing pointers in the physical partition sector 66 to each of these regions. More specifically, the pointers are comprised of sector addresses at which each of the regions of the physical partition sector 66 may be found. In a preferred embodiment, the geometry sector 64 is located within absolute sector "0", and the physical partition sector 66 is located within absolute sector "1".

The regions of the physical partition sector 66 include a remaps region 68, an event log region 70 and one or more user regions 72, although, in the embodiment of the invention disclosed herein, only a single user region 72 is disclosed. The geometry sector 64 contains information which the disk drive array controller 16 needs to access the SCSI disk drive 40-0. For example, for the SCSI disk drives illustrated herein, the geometry sector 64 would typically contain information related to error handling strategies, command queuing, etc. It is contemplated, however, that for other types of disk drives, the contents of the geometry sector would vary depending on the information needed by the disk drive array controller 16 to use those particular disk drives. For example, the geometry sector for an IDE type disk drive would contain cylinder, head and sector values needed by a disk drive array controller to access the IDE type disk drive.

Of the illustrated regions 68, 70, 72 of the physical partition sector 66, the remaps region 68 is unused for the SCSI disk drive 40-0. As a result, the remaps region has a zero size for the SCSI disk drive 40-0. It is contemplated, however, that for other types of disk drives, the remaps region 68 will be needed. Accordingly, it is expected that the remaps region 68 will have a positive size for other, non-SCSI type disk drives. The event log region 70 is used to log occurrences of disk errors and other events of interest. Finally, data to be stored on the SCSI disk drive 40-0 is placed within the user region 72. The user region 72 is comprised of two elements, the region itself where data is stored and a description sector 73 which describes how the user region 72 is used.

Referring next to FIG. 3, the description sector 73 which describes the user region 72 will now be described in greater detail. The user region 72 includes a start field 74, a size field 76, an element field 78, a pointer 80 and a composite unit (or "CUN") sector 82. The start and size fields 74 and 76 are 32-bit values which provide the location on the SCSI drive 40-0 where the user region 72 is located and the size of the user region 72, respectively. The element field 78 contains the position within the composite drive to which the SCSI drive 40-0 is to be mapped, a number which is unique to each element field 78 for the SCSI drive 40-0 through 40-5, 42-0 through 42-5 to be mapped to the composite drive. The pointer 80 provides a sector address where the CUN sector 82 is located and the CUN sector 82 contains specific data regarding the composite drive which is common for each SCSI drive to be configured as part of the composite drive.

Referring next to FIG. 4, the CUN sector 82, which contains information identical for each SCSI drive 40-0 through 40-5, 42-0 through 42-5 which comprises a portion of the composite drive, will now be described in greater detail. The CUN sector 82 is comprised of a tag field 84, an ID field 86, a type field 88, a # drives field 90, an interleave field 92, a color field 94, a virtual unit (or "VUN") field 96, a geometry field 98 and a text name field 100. The tag field 84 describes how the user region 72 is used and may either be "free", indicating that the SCSI drive 40-0 is not used as part of the composite drive, "used", indicating that the SCSI drive 40-0 is part of the SCSI drive or "spare", indicating that the SCSI drive 40-0 is to be used as an on-line spare for the composite drive. It should be noted that while the tag field is appended to the CUN sector 82, it is contemplated that, in an alternate embodiment of the invention, the tag field 84 could be provided as part of the description sector 73.

The ID field 86 is a 32-bit number used to identify each composite drive and is unique for each composite drive. The type field 88 is an 8-bit number which indicates a type of drive array and also specifies the number of SCSI drives used by the drive array for data redundancy. The # drives field 90 indicates the total number of SCSI drives that store user data. The interleave field 92 indicates the number of sectors on a SCSI drive may be used to store data before moving on to the next SCSI drive if additional data needs to be stored. The color field 94 is a second 32-bit number also used to identify the composite drive. However, the color field 94 also indicates the state of the SCSI drive and may, therefore, be used in conjunction with the ID field 86 to fully identify the SCSI drive. Typically, the color field 94 is used to exclude a drive which has previously failed but has since powered up again. The VUN field 96 duplicates the size field 76. The geometry field provides the data structure, typically in cylinder, head and sector values, for the SCSI drive and is used by the CPU 14 to access the SCSI drive. Finally, the name field 100 provides a text name for the composite drive.

When configuring the composite drive for the disk drive array controller 16, for example, during a power up of the computer system 10, the SCSI drives 40-0 through 40-5, 42-0 through 42-5 are each powered on so that the disk drive array controller 16 may read the geometry sector 64 for each of the SCSI drives such as the SCSI drive 40-0 and, using the acquired information, configure the SCSI drive. The disk drive array controller 16 then reads the user region 72 and sets up a data structure that contains pointers to the various data regions on the SCSI drive 40-0. Finally, the disk drive array controller 16 reads the CUN sector 82 which has since been pointed to as one of the data regions on the SCSI drive 40-0. As previously described, the CUN sector 82 provides the disk drive array controller 16 with a full description of the composite drive which the SCSI drive 40-0 participates in.

As the disk drive array controller 16 reads the CUN sector 82 for each of the SCSI drives 40-0 through 40-5, 42-0 through 42-5, the disk drive array controller 16 compares that CUN sector 82 to those previously read to determine the number of composite drives to be configured for the disk drive array controller 16. For example, if, after configuring each of the SCSI drives 40-0 through 40-5, 42-0 through 42-5, the disk drive array controller 16 has read only one CUN sector 82, only one composite drive is coupled to the disk drive array controller 16. Once the CUN sector 82 is read for each of the SCSI drives 40-0 through 40-5, 42-0 through 42-5, the disk drive array controller 16 then reads the configuration of the disk drive array controller 16 from the NVRAM 56. Included as part of the configuration of the disk drive array controller 16 is an ordered list of 32-bit CUN IDs, each of which represents a potential composite drive which can be addressed by the CPU 14 using the disk drive array controller 16. The disk drive array controller 16 then compares the CUN IDs read from the SCSI drives 40-0 through 40-5, 42-0 through 42-5 to the list of CUN IDs read from the NVRAM 56 and, for each match, the disk drive array controller 16 sets up a pointer to each of the SCSI drives 40-0 through 40-5, 42-0 through 42-5 which contains a matching CUN ID to map installed composite drive or drives to appropriate positions which are accessible by the CPU 14.

More specifically, as previously set forth, the type field 88 indicates the total number of SCSI drives used for data redundancy while the # drives field 90 indicates the total number of SCSI drives used to store user data. By combining these two numbers, the disk drive array controller 16 determines the total number of SCSI drives included in the composite drive. From that, a drive position list may be generated. For example, in the embodiment of the invention disclosed herein, ten SCSI drives are included in the composite drive. Accordingly, a position list containing positions 0–9 is generated by the disk drive array controller 16. Then, using the element field 78 of the description sector 73 for each SCSI drive 40-0 through 40-5, 42-0 through 42-5 included as part of the composite drive, which, as previously stated, contains a disk drive position for that particular SCSI drive, the disk drive array controller 16 maps each of the SCSI drives 40-0 through 40-5, 42-0 through 42-5 included as part of the composite drive to the disk drive position indicated in the element field 78.

Referring next to FIG. 5, a virtual map of the subject composite drive may now be seen. The composite drive is comprised of ten SCSI drives which are selectively mapped to positions 0–9 of the composite drive. The location of the SCSI drive mapped to each position of the composite drive is provided by a coordinate pair, the first coordinate indicating the SCSI bus (either SCSI-0 or SCSI-1) on which the SCSI drive is installed and the second coordinate indicating the particular SCSI drive (40-0 through 40-5, 42-0 through 42-5) from that SCSI bus which is mapped to that position for the composite drive. Thus, in the embodiment of the invention disclosed herein, SCSI drive 40-0 is mapped to position 0, SCSI drive 42-5 is mapped to position 1, SCSI drive 40-2 is mapped to position 2, SCSI drive 40-4 is mapped to position 3, SCSI drive 40-5 is mapped to position 4. SCSI drive 42-0 is mapped to position 5, SCSI drive 40-1 is mapped to position 6, SCSI drive 42-3 is mapped to position 7, SCSI drive 42-1 is mapped to position 8 and SCSI drive 42-2 is mapped to position 9.

For each composite drive which is mapped in, the disk drive array controller 16 will review the SCSI drives location to determine if any locations exist which do not have an associated SCSI drive. If any composite drives contain such a location, and some SCSI drives have been "tagged" as spare, the tagged spare SCSI drives will be auto-mapped to these particular locations. At this point, data reconstruction can begin on the tagged spare drives.

The foregoing detailed description is to be clearly understood as being given by way of illustration and example only, the spirit and scope of the present invention being limited solely by the appended claims.

What is claimed is:

1. A method for configuring a composite drive for a disk drive array controller within a computer system, comprising the steps of:

installing a plurality of disk drives on a bus of said computer system, each of said plurality of disk drives having a user data region, a first portion of which contains a first subset of information common to each of said plurality of disk drives and a second portion of which contains a second subset of information specific to each of said disk drives, wherein said first subset of information is comprised of a first field which indicates a total number of physical drives in said composite drive used for data storage and a second field which indicates a total number of physical drives in said composite drive used for data redundancy, and wherein said second subset of information is comprised of a logical position of said each of said plurality of disk drives within said composite drive;

combining said first and second fields to determine a total number of physical drives included as a part of said composite drive:

combining said logical position of each of said disk drives with said total number of physical disk drives included as part of said composite drive to determine said configuration for said composite drive; and mapping said composite drive using said determined configuration for said composite drive.

2. A method for configuring a composite drive according to claim 1 further comprising the step of generating a physical drive position list for said composite drive.

3. A method for configuring a composite drive according to claim 2 wherein each of said disk drives is a SCSI type drive.

4. A method for configuring at least one composite drive for a disk drive array controller, comprising the steps of:

installing said disk drive array controller within a computer system, said disk drive array controller having a memory portion in which a list of a plurality of composite drives installed on a bus of said computer system is stored;

installing a plurality of disk drives on said bus of said computer system, each of said disk drives having a user data region including a first portion and a second portion, said first portion of which contains a first field containing a composite drive ID number for a composite drive, a second field which indicates the total number of physical disk drives in said composite drive which are used for data storage, and a third field which indicates the total number of physical disk drives in said composite drive which are used for data redundancy, said second portion of which contains a logical position of said each of said plurality of disk drives within said composite drive corresponding to said composite drive ID number;

comparing said composite drive ID number for each of said plurality of disk drives to said list of said plurality of composite drives;

combining said second and third fields of at least one of said plurality of disk drives having an associated composite drive ID number that matches a listed composite drive to determine the total number of physical disk drives included as part of said listed composite drive;

determining a configuration for said listed composite drive using said total number of physical disk drives included as part of said listed composite drive and said logical position of each disk drive having said composite drive ID number that matches said listed composite drive ID; and mapping said listed composite drive using said configuration.

5. The method for configuring at least one composite drive according to claim 4 further comprising the step of generating a physical drive position list for said listed composite drive.

6. A method for configuring at least one composite drive according to claim 5 wherein each of said disk drives is a SCSI type drive.

7. A method for configuring at least one composite drive according to claim 6 wherein said disk drive array controller further comprises a non-volatile random access memory for storing said list of composite drives.

8. A method for configuring a composite drive for a disk drive array controller within a computer system comprising the steps of:

installing a plurality of disk drives in a first physical arrangement on a bus of said computer system, each of said disk drives having a user data region, a first portion of which includes a first subset of information indicative of a total number of physical disk drives included as part of said composite drive and a second portion including a second subset of information comprised of a logical position of said each of said plurality of disk drives within said composite drive;

reading said first subset of information and said second subset of information from said each of said plurality of disk drives;

mapping said each of said plurality of disk drives within said composite drive according to said logical position indicated by said second subset of information read from said each of said plurality of disk drives;

re-installing said plurality of disk drives in a second physical arrangement different from said first physical arrangement;

re-reading said first subset of information and said second subset of information from said each of said plurality of disk drives; and re-mapping said each of said plurality of disk drives within said composite drive according to said logical position indicated by said second subset of information re-read from said each of said plurality of disk drives.

9. The method for configuring a composite drive according to claim 8 wherein said logical position of said each of said plurality of disk drives is independent of a physical position of said each of said plurality of disk drives on said bus on said computer system.

10. The method for configuring a composite drive according to claim 8 comprising the further step of generating a drive position list for said composite drive, wherein said drive position list is indicative of a correlation between said logical position of each of said plurality of disk drives and a physical position of said each of said plurality of disk drives on said bus.

11. The method for configuring a composite drive according to claim 8 wherein each of said plurality of disk drives is a SCSI type drive.

12. The method for configuring a composite drive as recited in claim 8 comprising the further steps of:

combining said first subset of information and said second subset of information to determine a configuration for said composite drive; and determining whether a particular logical position within said composite drive is void of an associated physical disk drive.

\* \* \* \* \*